US 6,947,188 B2

United States Patent
Miles et al.

(10) Patent No.: US 6,947,188 B2
(45) Date of Patent: Sep. 20, 2005

(54) HIGH STROKE PIXEL FOR A DEFORMABLE MIRROR

(75) Inventors: Robin R. Miles, Danville, CA (US); Alexandros P. Papavasiliou, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/392,594

(22) Filed: Mar. 18, 2003

(65) Prior Publication Data

US 2004/0184135 A1 Sep. 23, 2004

(51) Int. Cl.⁷ .............................................. G02B 26/08
(52) U.S. Cl. ...................................... 359/198; 359/224
(58) Field of Search ................................ 359/198, 223, 359/224, 290, 291, 295, 298; 310/36, 90, 309, 20, 328

(56) References Cited

U.S. PATENT DOCUMENTS 5,969,848 A * 10/1999 Lee et al. .................... 359/298
6,498,870 B1 * 12/2002 Wu et al. ..................... 385/18
2003/0142934 A1 * 7/2003 Pan et al. ..................... 385/116
2003/0156315 A1 * 8/2003 Li et al. ....................... 359/290

* cited by examiner

Primary Examiner—Georgia Epps
Assistant Examiner—William Choi
(74) Attorney, Agent, or Firm—Michael C. Staggs; L. E. Carnahan; Alan H. Thompson

(57) ABSTRACT

A mirror pixel that can be fabricated using standard MEMS methods for a deformable mirror. The pixel is electrostatically actuated and is capable of the high deflections needed for spaced-based mirror applications. In one embodiment, the mirror comprises three layers, a top or mirror layer, a middle layer which consists of flexures, and a comb drive layer, with the flexures of the middle layer attached to the mirror layer and to the comb drive layer. The comb drives are attached to a frame via spring flexures. A number of these mirror pixels can be used to construct a large mirror assembly. The actuator for the mirror pixel may be configured as a crenellated beam with one end fixedly secured, or configured as a scissor jack. The mirror pixels may be used in various applications requiring high stroke adaptive optics.

27 Claims, 4 Drawing Sheets

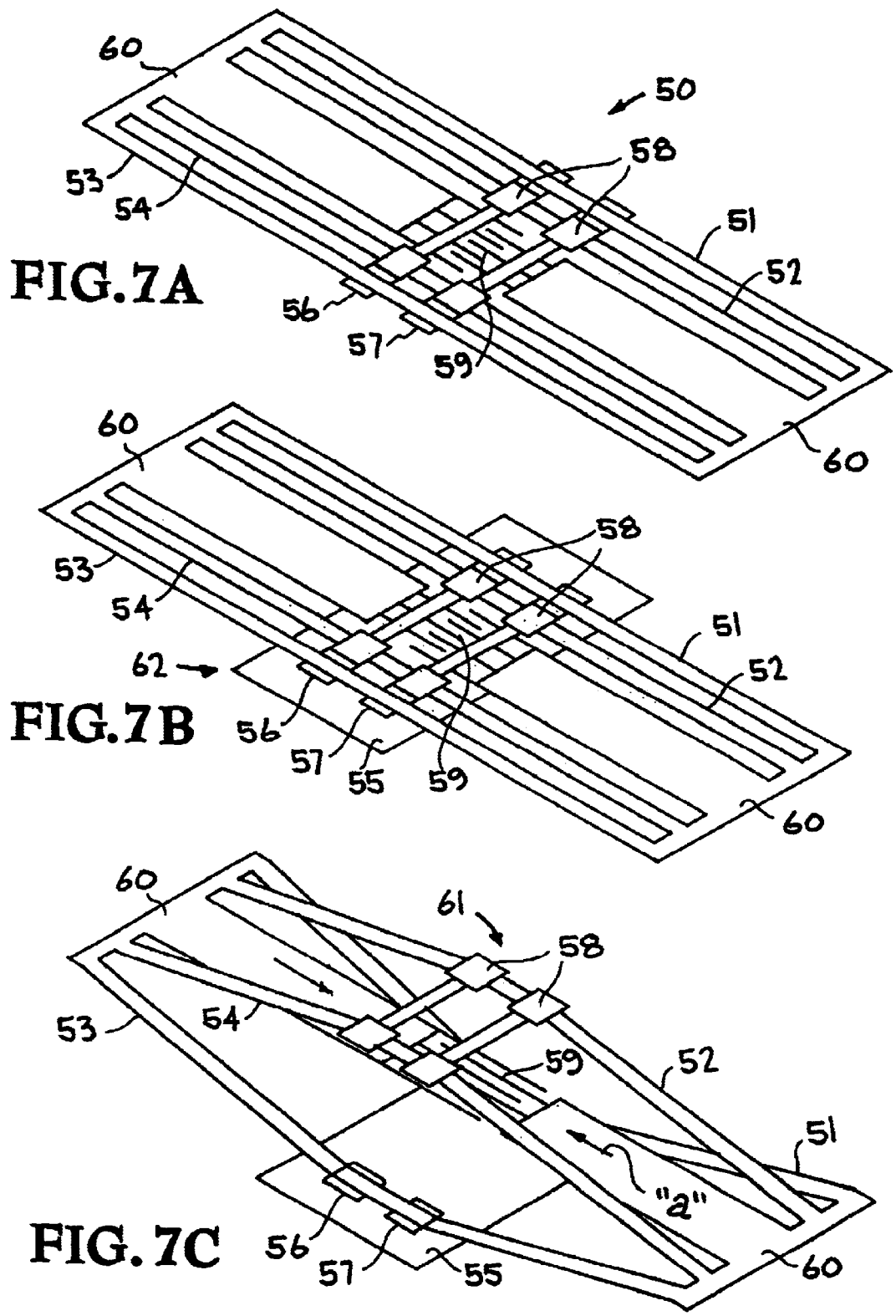

ent No. W-7405-ENG-48 between the United States Department of Energy and the University of California for the operation of Lawrence Livermore National Laboratory.

HIGH STROKE PIXEL FOR A DEFORMABLE MIRROR

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to deformable mirrors, particularly to high stroke pixels for a deformable mirror, and more particularly to a configuration of a pixel for a MEMS deformable mirror that is electrostatically actuated and is capable of high deflections needed for spaced-based mirror applications.

Space-based optical surveillance systems require lightweight deformable mirrors. MEMS technology for adaptive optic systems is attractive because it is lightweight and uses little power. However, there are currently few mirror technologies available that are capable of high deflections needed for these requirements. No approaches have demonstrated large deflections of mirror surfaces.

The present invention satisfies the requirements for space-based surveillance systems by providing a configuration of a pixel for a MEMS deformable mirror that is electrostatically actuated and which is capable of the high deflections (high strokes) needed for space-based mirror applications. Also, the pixel of this invention can be utilized in other applications where adaptive optics are used, such as medical uses in opthamology.

SUMMARY OF THE INVENTION

The present invention provides a mirror pixel.

Another aspect of the invention is to provide a deformable mirror assembly composed of a mirror pixel fabricated using standard microfabrication (MEMS) methods.

Another aspect of the invention is to provide a high stroke pixel for a deformable mirror.

Another aspect of the invention is to provide a mirror pixel for applications utilizing adaptive optics, such as for space-based telescopes or for opthamology applications.

A final aspect of the invention is to provide configurations of pixels for MEMS deformable mirrors that are electrostatically actuated and which are capable of the high deflections (high strokes) needed for space-based mirror applications.

Accordingly, the present invention may be utilized by NASA or military space-based applications, as well as to provide high stroke adaptive optics for space-based telescopes, for example, or for medical uses in ophthalmology.

BRIEF DESCRIPTION OF THE DRAWINGS

The accompanying drawings, which are incorporated into and form a part of the disclosure, illustrate an embodiment of the invention and, together with the description, serve to explain the principles of the invention.

FIGS. 7A, 7B, and 7C illustrate an embodiment of the high stroke actuator of the invention in a scissor jack configuration, with FIGS. 7B and 7C showing the lower and raised configuration of the actuator of FIG. 7A.

DETAILED DESCRIPTION OF THE INVENTION

General Description

Generally, the invention involves a high stroke pixel for a deformable mirror. A number of the mirror pixels can be used to construct a completed mirror assembly. The pixels disclosed in the present invention are fabricated with standard MEMS methods, and are basically composed of three layers: 1) a top or mirror layer, 2) a comb drive layer, and 3) a middle layer consisting of flexures that attach the mirror layer to the comb drive layer. In one embodiment, the mirror is attached to a center section of the drive layer, and in one embodiment, a scissors jack arrangement is utilized. As the comb drives are actuated, the flexures bend upward pushing the mirror surface upward, and deactivation of the comb drives allow the flexures to return to a flat configuration so as to lower the mirror surface.

Specific Description

The invention is directed to configurations of a pixel for a MEMS deformable mirror that is electrostatically actuated and which is capable of the high deflections needed for space-based mirror applications. The pixel provides high stroke adaptive optics for space-based telescopes, for example. The high stroke aspect is 10–50 $\mu$m vertical displacement. With a pixel of 500 $\mu$m by 500 $\mu$m, the vertical deflection is 5 $\mu$m to 100 $\mu$m, and the horizontal movement is 1 $\mu$m to 5 $\mu$m. MEMS technology for adaptive optic systems is attractive because it is lightweight and uses little power, and this is an effective approach for the fabrication of space-based optical surveillance systems, for example, which require light-weight deformable mirrors.

Figure 1A:
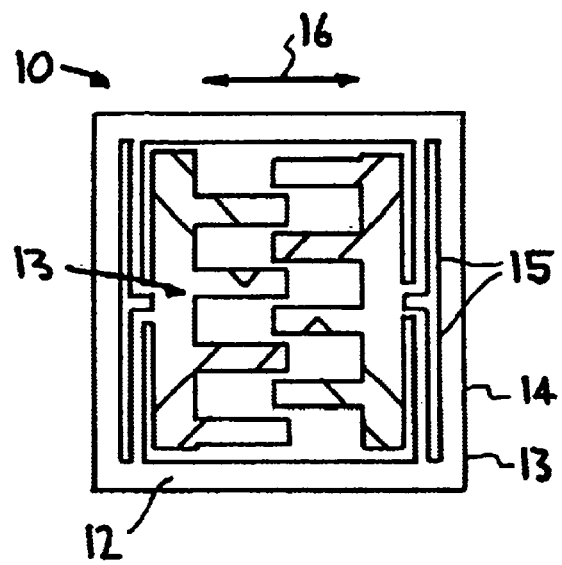
FIG. 1A is a top or plan view of an embodiment of a mirror pixel made in accordance with the present invention.
Figure 1B:
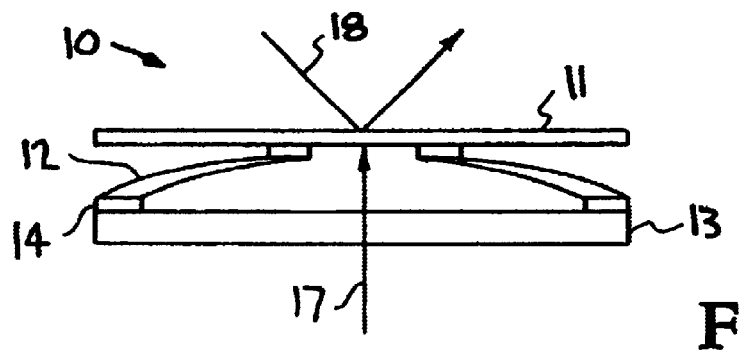
FIG. 1B is a side view of the pixel of FIG. 1A in the deflected or actuated state.
Figure 1C:
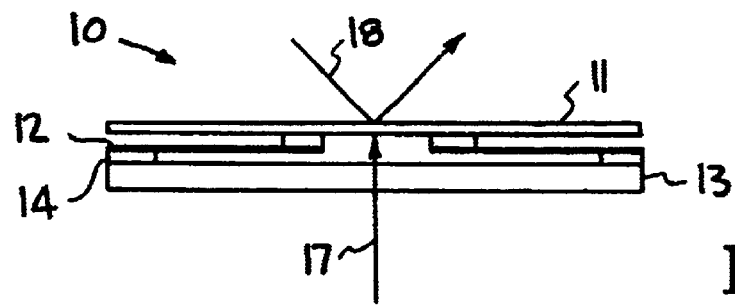
FIG. 1C is a view similar to FIG. 1B but in the undeflected or inactivated state.

A first embodiment of the mirror pixel of the invention is illustrated in FIGS. 1A–1C, with a top view shown in FIG. 1A, with a deflected side view shown in FIG. 1B and an undeflected side view shown in FIG. 1C.

The illustrated embodiment of FIGS. 1A–1C is composed basically of three layers. A top layer is the mirror layer which can be fabricated using a layer of an SOI wafer for a polished surface and rigidly needed for good optical properties. The middle layer consists of flexures that attach the mirror or top layer to a comb drive layer. The comb drives are attached to the frame through spring flexures. As the comb devices are actuated by an applied electric field, the vertical flexures bend upward pushing the mirror surface upward (see FIG. 1B). Release of the electric field applied to the comb drives allow the vertical flexures to return to a flat configuration and lowers the mirrors (see FIG. 1C). As pointed out above, a number of the pixels can be used to construct a completed mirror.

Referring now to FIGS. 1A–1C of the drawings, a mirror pixel generally indicated at 10, comprises three layers, a top or mirror layer 11, a middle or vertical flexures layer 12, and a horizontal comb drive layer 13, with the middle layer 12 consisting of vertical flexures that attach the mirror layer 11 to the comb drive layer 13. The vertical flexures layer 12 and comb drive layer 13 function as an actuator for mirror layer 11. An insulating pad 14 is located intermediate the vertical flexure layer 12 and the comb drive layer 13. The comb drive is attached to a frame through spring flexures 15. The horizontal comb drive actuation is illustrated by double arrow 16 and the vertical deflection is illustrated by arrow 17, with reflected light on mirror layer 11 being illustrated by arrow 18.

In operation, as the comb drive layer 13 moves (is activated), as indicated by arrow 16, by an electric field, the vertical flexures of layer 12 bend upward pushing the mirror layer 11 upward as indicated by arrow 17 (see FIG. 1B). Release of the electric field applied to the comb drive 13 allows the vertical flexures of layer 12 to return to a flat configuration and lowers mirror layer 11, as shown in FIG. 1C.

Figure 2A:
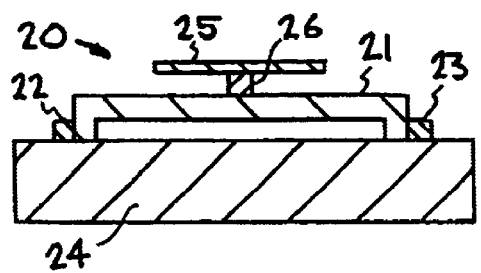
FIGS. 2A and 2B illustrate another embodiment made in accordance with the present invention using a single thermal actuator beam.
Figure 2B:
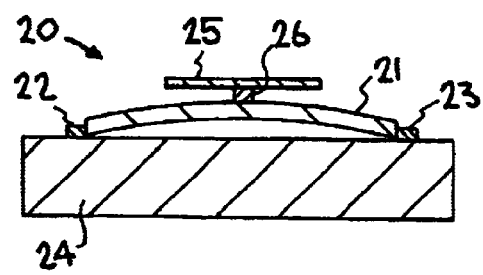

A variation of the high stroke deformable mirror illustrated in FIGS. 1A–1C is in the configuration of a thermal actuator, as seen in the FIGS. 2A–2B embodiment. This embodiment uses a single beam, pinned at both ends with an attachment to a mirror at the center. The beam is heated by passing an electric current through it. As the temperature rises and the beam expands. Since the beam is pinned at both ends, the expansion induces a stress in the beam which at a sufficiently high temperature will buckle the beam. The beam can be designed in such a way that buckling will always force the mirror upwards. The beam is designed to be wider than it is thick so that the stiffness is in the vertical direction is less than the stiffness in the horizontal direction. This eliminates possibility of horizontal movement.

Referring now to FIGS. 2A–2B, an actuator generally indicated at 20 comprises a beam 21 pinned or secured at each end 22 and 23 to a substrate or frame 24, with a mirror 25 mounted to the center of beam 21 via an attachment 26. An electrical source, not shown, is connected to beam 21 causing heating of the beam whereby the beam expands from its flat condition of FIG. 2A to a buckled or bowed condition of FIG. 2B causing raising of the mirror 25 from its position in FIG. 2A to that of FIG. 2B. The amount of expansion and thus upward bowing to the beam 21 can be engineered by the composition, width, length, and thickness of the beam 21 as well as by the amount of electrical heating applied thereto.

Figure 3:
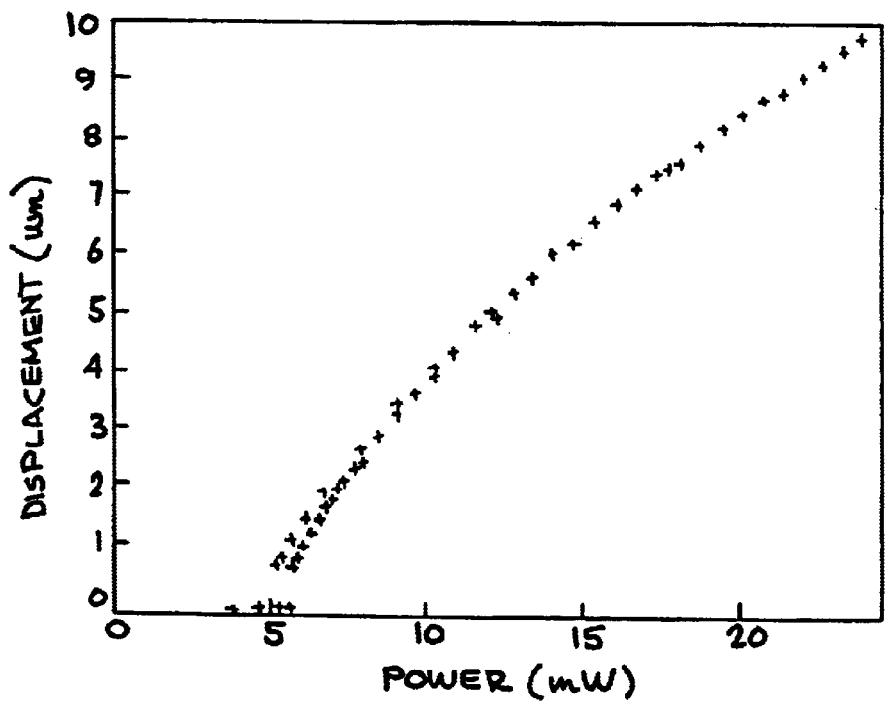
FIG. 3 graphically illustrates a plot of displacement of the beam of FIGS. 2A–2B as a function of input power.

The thermal actuator device of FIGS. 2A–2B has been experimentally demonstrated, and a plot of displacement as a function of input power (electrical current) is illustrated in FIG. 3.

The beam 21 actuator 20 of FIGS. 2A–2B can be crenellated so that buckling in the vertical direction will force the beam up, away from substrate 24. Engineered buckling through beam crenellation is described hereinafter with respect to FIGS. 4–6.

An important addition that improves the "high stroke pixel for a deformable mirror" is the crenellated beam for engineered buckling. The buckling direction of straight beams, as in FIGS. 2A–2B, that are fabricated in flat layers as described above is unpredictable. The pixel can buckle in such a way as to push the mirror down against the substrate instead of pushing it up. To combat this, crenellations can be added to a beam to make it buckle in the desired direction and thus push the mirror up.

Figure 4:
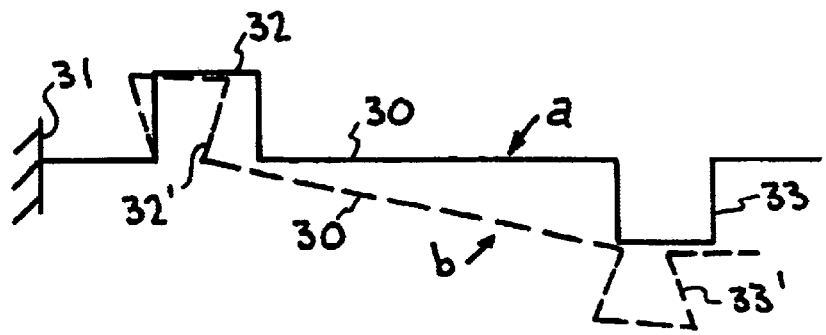
FIG. 4 schematically illustrates an embodiment of a crenellated beam, to provide engineered buckling.
Figure 5:
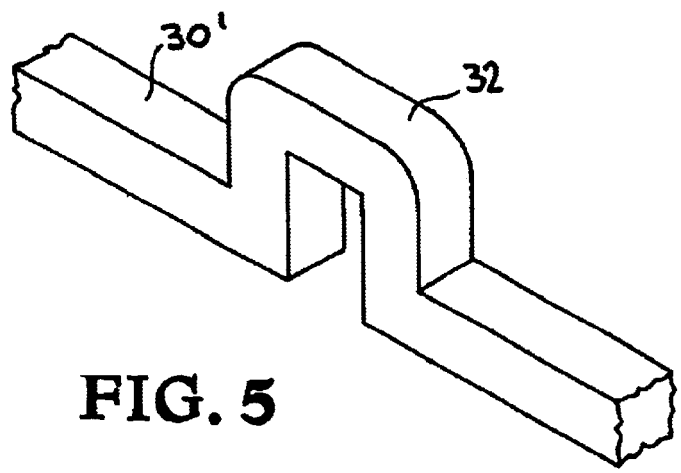
FIG. 5 illustrates a three-dimensional crenellated beam.

FIG. 4 shows the cross section of a crenellated beam and an exaggerated response to an axial load, with FIG. 5 illustrating a three-dimensional crenellated beam. As shown in FIG. 4, the beam 30, fixed at one end to a support or substrate 31, is provided with a pair of U-shaped sections 32 and 33. When heat is applied, the U-shaped sections contract as indicated by section 32' and 33' as beam 30 moves from is initial position "a" to its expanded condition "b".

The beam crenellations can be achieved by depositing the polysilicon of the beam above previously deposited layers that are patterned to leave an uneven surface. FIG. 5 shows a cross section of deposited layers that form a crenellated beam. Two layers must be deposited and patterned to form the uneven surface. Note that the first patterned layer can be replaced by merely etching a pit in the substrate material. Then a sacrificial layer is deposited allowing the beam layer to eventually be released. Finally, the beam layer is deposited and patterned to form the beam.

Figure 6:
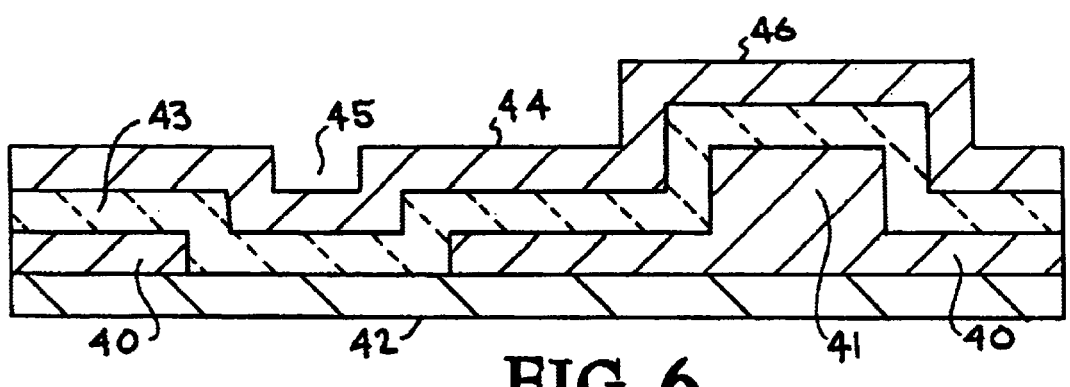
FIG. 6 is a cross-sectional view illustrating the formation a crenellated beam similar to that of FIG. 5.

As shown in FIG. 6, patterned layers 40 and 41 have been deposited on substrate 42, with a sacrificial layer 43 deposited over the surfaces of layers 40 and 41, after which a layer of material forming a beam 44 is deposited on the sacrificial layer 43. Upon removal of the deposited beam 44, it will include U-shaped sections 45 and 46, similar to those of FIG. 4. As pointed out above, the layer 40 may be eliminated by forming a U-shaped cut or countersink in the upper surface of substrate 42, with layer 41 being deposited on the substrate, whereafter the sacrificial layer 43 is deposited on the exposed surfaces of the substrate 42 and layer 41, and then beam forming material is deposited over the sacrificial layer 43.

Another variation of the high stroke actuator is the scissors jack architecture. This type of device can work much like an automobile scissors jack. The scissors jack is actuated by an electrostatic comb drive in the center of the device. The comb drive pulls the two ends towards each other forcing the suspension beam to buckle. One set of beams connects electrostatic comb drive to the substrate. These beams are designed to buckle in such a way as to force the comb drive up, away from the substrate. Another set of beams connects the comb drive to an insulating connector that is itself connected to the mirror. These beams buckle to force the insulating connector up and away from the comb drive. The resulting displacement of the insulating connector and mirror is the sum of the displacements of the two sets of beams. The two sets of beams apply opposite and canceling moments on the comb drive.

FIGS. 7A–7C illustrate an embodiment of a scissors jack actuator, with the mirror omitted for clarity. As shown in FIG. 7A, the actuator 50 comprises two sets of buckling beams 51–52 and 53–54, with beams 53–54 being connected to a substrate 55 as indicated at 56–57. Buckling beams 51–52 are interconnected via an insulating connector 58. While not shown, a mirror is capable of being mounted to insulating connector 58. An electrostatic comb drive 59 is mounted to buckling beams 53–54 and to substrate 55 with outer ends of buckling beam sets 51–52 and 53–54 being connected at 60 as seen in FIG. 7C. Actuation of the comb drive 59 produces an electrostatic force indicated by arrows "a" which pulls the ends of beams 53–54 towards each other forcing the buckling beams 51–52 to buckle upwardly to a raised position indicated at 61, as seen in FIG. 7C. Deactivation of the comb drive returns the beam sets 51–52 and 53–54 to their initial or flat or lowered position 62 as shown in FIG. 7B.

The scissors jack can be fabricated with conventional surface micro-machining techniques. The buckling beams, electrostatic comb drive and connections to the substrate can all be fabricated from polycrystalline silicon. The insulating connector can be fabricated from silicon nitride or possibly from a patternable polymer such as SU-8. These layers can be fabricated on top of a sacrificial silicon dioxide layer; and are capable of being suspended above the substrate when the silicon dioxide layer is etched away with hydrofluoric acid. The crenellations necessary to force buckling in the desired direction are capable of being fabricated as outlined in the discussion of Engineered buckling through beam crenellations. All of these processes are common micro-machining techniques.

It has thus been shown that the present invention provides a pixel for a deformable mirror which can be electrostatically actuated, and which is capable of the high defections needed for space-based mirror applications. The invention utilizes standard MEMS methods for fabrication of the adaptive optics system, and is lightweight and uses little power.

While the particular embodiments of the invention have been illustrated and described to exemplify and teach the principles of the invention, such is not intended to be limiting. Modifications and changes may become apparent to those skilled in the art, and it is intended that the invention be limited only by the scope of the appended claims.

What is claimed is:

1. A pixel for a deformable mirror, comprising:
   a mirror layer,
   a vertical flexure layer, and
   a comb drive layer, wherein said vertical flexure layer is attached to said mirror layer and to said comb drive layer and wherein an insulating pad is positioned between said vertical flexure layer and said comb drive layer.

2. The pixel of claim 1, additionally including a frame, said frame being mounted to said comb drive layer via spring flexures.

3. The pixel of claim 1, including a number of similarly constructed pixels for forming a deformable mirror.

4. A deformable mirror having a plurality of electrostatically actuated pixels constructed to provide vertical deflection upon a horizontal drive actuation, wherein each said electrostatically actuated pixel includes a mirror section, a comb drive section, and a vertical flexure section.

5. The deformable mirror of claim 4, wherein each of said pixels is fabricated by MEMS technology.

6. The deformable mirror of claim 4, additionally including an insulating pad between said comb drive section and said vertical flexure section.

7. The deformable mirror of claim 4, additionally including a frame and spring flexures mounted to said frame and comb drive section.

8. The deformable mirror of claim 4, wherein said comb drive section is electrostatically actuated.

9. A deformable mirror, comprising:
   a plurality of mirror pixels constructed to endure high deflections needed for space-based mirror applications,
   each of said mirror pixels includes:
   a mirror layer,
   a comb drive, and
   vertical flexures interconnecting said mirror layer and said comb drive,
   said comb drive being electrostatically activated to move horizontally causing said vertical flexures to bend thereby raising said mirror layer, and upon deactivation of said comb drive said vertical flexures return to a flat configuration thereby lowering said mirror layer.

10. The mirror of claim 9, additionally including at least one insulating pad between said comb drive and said vertical flexure.

11. The mirror of claim 10, additionally including a frame, and spring flexures interconnecting said comb drive and said frame.

12. A mirror pixel comprising:
    a layer defining a mirror,
    a comb drive, and
    a layer containing vertical flexures interconnecting said comb drive and said mirror, wherein said layer containing vertical flexures further comprises at least one insulating pad positioned between said comb drive and said layer containing vertical flexures,
    whereby upon activation of said comb drive said vertical flexures change configuration to cause said mirror to raise, and upon deactivation of said comb drive said vertical flexures change configuration to cause said mirror to lower.

13. The mirror pixel of claim 12, additionally includes a frame, said frame being mounted to said comb drive by a plurality of spring flexures.

14. The mirror pixel of claim 12, including a number of similar mirror pixels to form a deformable mirror.

15. A deformable mirror, comprising:
    at least one mirror pixel, and
    an actuator for raising and lowering said mirror pixel including at least one flexible member, wherein said actuator includes at least one flexible member comprising a beam secured at each end with said mirror pixel mounted to an actuated section of said beam, wherein said actuator includes a layer containing at least one vertical flexure, and a comb drive layer, said vertical flexure layer being mounted intermediate said at least one mirror pixel and said comb drive layer and wherein at least one insulating pad is configured intermediate said vertical flexure layer and said comb drive layer.

16. The deformable mirror of claim 15, wherein said beam is secured at each end to a substrate, and additionally including means for heating said beam causing expansion thereof in an upward direction.

17. The deformable mirror of claim 16, wherein said beam is crenellated so that buckling in a vertical direction will force the beam upward away from said substrate.

18. The deformable mirror of claim 16, wherein said means for heating comprises means for passing an electric current therethrough causing said expansion of the beam.

19. The deformable mirror of claim 15, wherein said beam has a width greater than a thickness thereof such that stiffness is in a vertical direction.

20. The deformable mirror of claim 15, wherein said actuator includes at least one crenellated beam constructed so that expansion thereof causes movement in a vertical direction.

21. The deformable mirror of claim 20, wherein said crenellated beam is formed by:
    providing a substrate,
    forming a first layer on the substrate,
    removing a section of said first layer,
    forming a second layer on a section of said first layer,
    depositing a layer of beam forming material on the exposed surface of said first layer, said area of said removed section of said first layer, and said second layer, and
    removing said deposited layer of beam forming material.

22. The deformable mirror of claim 21, wherein forming said crenellated beam additionally includes depositing a sacrificial layer prior to depositing the layer of beam forming material, and removing the sacrificial layer following depositing of the layer of beam forming material.

23. The deformable mirror of claim 21, wherein removing the section of said first layer, and forming said second layer, are carried out to produce a crenellated beam having a desired configuration.

24. The deformable mirror of claim 15, wherein said actuator comprises a scissors jack including an electrostatic comb drive.

25. The deformable mirror of claim 24, wherein said scissor jack additionally includes at least one pair of interconnected buckling beams, each beam being fixedly secured at an opposite end thereof.

26. The deformable mirror of claim 25, wherein said at least one pair of interconnected buckling beams are interconnected via at least one insulating connector.

27. The deformable mirror of claim 15, wherein said actuator is mounted to a frame via spring flexures.

* * * * *